US011948916B2

(12) United States Patent
Kariyazaki (10) Patent No.: US 11,948,916 B2
(45) Date of Patent: Apr. 2, 2024

(54) SEMICONDUCTOR DEVICE HAVING A PLURALITY OF TERMINALS ARRANGED THEREON

(71) Applicant: RENESAS ELECTRONICS CORPORATION, Tokyo (JP)

(72) Inventor: Shuuichi Kariyazaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/507,271

(22) Filed: Oct. 21, 2021

(65) Prior Publication Data

US 2022/0139877 A1    May 5, 2022

(30) Foreign Application Priority Data

Oct. 29, 2020 (JP) .................................. 2020-180995

(51) Int. Cl.
*H01L 25/065* (2023.01)
*H01L 23/00* (2006.01)
(Continued)

(52) U.S. Cl.
CPC .... *H01L 25/0655* (2013.01); *H01L 23/49822* (2013.01); *H01L 23/5383* (2013.01);
(Continued)

(58) Field of Classification Search
CPC ..... H01L 2223/6638; H01L 2924/1517; H01L 23/49822; H01L 23/49838; H01L 23/5383;
(Continued)

(56) References Cited

U.S. PATENT DOCUMENTS 8,091,061 B2   1/2012 Betsui et al.
9,853,002 B2  12/2017 Kariyazaki
(Continued)

FOREIGN PATENT DOCUMENTS

JP    2007-213375 A    8/2007
JP    2010-192767 A    9/2010
(Continued)

OTHER PUBLICATIONS

Office Action issued in the corresponding Japanese Application No. 2020-180995 dated Feb. 6, 2024, with English Translation.

*Primary Examiner* — Phat X Cao
*Assistant Examiner* — William Henry Anderson
(74) *Attorney, Agent, or Firm* — Rimon, P.C.

(57) ABSTRACT

The electronic device includes a first semiconductor device having a logic circuit, a second semiconductor device having a memory circuit, and a wiring substrate to which the first and second semiconductor devices are mounted. The first semiconductor device has a plurality of terminals arranged on a main surface. The plurality of terminals includes a plurality of differential pair terminals electrically connected to the second semiconductor device and to which differential signals are transmitted. The plurality of differential pair terminals is arranged along a side of the main surface, that is extending in an X direction, and includes a first differential pair terminal constituted by a pair of terminals arranged along a Y direction orthogonal to the X direction, and a second differential pair terminal constituted by a pair of terminals arranged along the Y direction. The first and second differential pair terminals are arranged along the Y direction.

6 Claims, 7 Drawing Sheets

(51) Int. Cl.
*H01L 23/498* (2006.01)
*H01L 23/538* (2006.01)

(52) U.S. Cl.
CPC .............. *H01L 24/16* (2013.01); *H01L 24/17*
(2013.01); *H01L 2223/6638* (2013.01); *H01L 2224/16235* (2013.01); *H01L 2224/17515* (2013.01); *H01L 2924/381* (2013.01)

(58) Field of Classification Search
CPC ......... H01L 23/5386; H01L 2224/0651; H01L 2224/0951; H01L 2224/1451; H01L 2224/1751; H01L 2224/3051; H01L 2224/3351; H01L 2224/06515; H01L 2224/09515; H01L 2224/14515; H01L 2224/17515; H01L 2224/30515; H01L 2224/33515
See application file for complete search history.

(56) References Cited

U.S. PATENT DOCUMENTS

| | | | | |
|---|---|---|---|---|
| 2019/0198462 A1* | 6/2019 | Nakagawa | .......... | H01L 23/3675 |
| 2019/0198463 A1* | 6/2019 | Kariyazaki | ....... | H01L 23/49822 |
| 2019/0363050 A1* | 11/2019 | Kariyazaki | ......... | H04L 25/0298 |
| 2022/0084849 A1* | 3/2022 | Ma | ....................... | H05K 5/0247 |
| 2022/0375804 A1* | 11/2022 | Isozumi | ................ | H01L 23/647 |

FOREIGN PATENT DOCUMENTS

| | | |
|---|---|---|
| JP | 2010-212296 A | 9/2010 |
| JP | 2017-112330 A | 6/2017 |

* cited by examiner

SEMICONDUCTOR DEVICE HAVING A PLURALITY OF TERMINALS ARRANGED THEREON

CROSS-REFERENCE TO RELATED APPLICATIONS

The disclosure of Japanese Patent Application No. 2020-180995 filed on Oct. 29, 2020 including the specification, drawings and abstract is incorporated herein by reference in its entirety.

BACKGROUND

The present invention relates to an electronic device and a semiconductor device that is mounted on the electronic device.

There are disclosed techniques listed below.
[Patent Document 1] Japanese Unexamined Patent Application Publication No. 2007-213375

There is an electronic device (semiconductor module) in which a semiconductor device comprising a logic circuit and a semiconductor device comprising a memory circuit are mounted on a wiring substrate, the electronic device electrically connecting these components (see, for example, Patent Document 1).

SUMMARY

One of the requirements for improving the performance of an electronic device as described above includes, for example, a requirement for increasing transmission speed between the logic circuit and the memory circuit, or a requirement for miniaturizing the device. However, as the transmission speed is increased, the size of the electronic device is more likely to increase. In order to suppress an increase in the size of the electronic device caused by an increase in the transmission speed, a technique in which a large number of signal transmission paths are implemented in high density is necessary. In addition, in order to perform high-speed transmission, it is necessary to stabilize a path for supplying power, and it is necessary to secure a stable supply path of the power in addition to the large number of signal transmission paths.

Other problems and novel characteristics will be apparent from the description in the present specification and accompanying drawings.

The electronic device according to one embodiment comprises a first semiconductor device comprising a logic circuit, a second semiconductor device electrically connected to the first semiconductor device and comprising a memory circuit, and a wiring substrate on which the first semiconductor device and the second semiconductor device are mounted. The first semiconductor device has a first surface and a plurality of terminals arranged on the first surface. The plurality of terminals includes a plurality of differential pair terminals electrically connected to the second semiconductor device and to which differential signals are transmitted. The plurality of differential pair terminals is arranged along a first side of the first surface, that is extending in a first direction, and includes a first differential pair terminal constituted by a pair of terminals arranged along a second direction orthogonal to the first direction, and a second differential pair terminal constituted by a pair of terminals arranged along the second direction. The first differential pair terminal and the second differential pair terminal are arranged along the second direction.

According to the above-described embodiment, performance of the electronic device can be improved.

DETAILED DESCRIPTION (Explanation of Description Format, Basic Terminology and Usage in Present Application)

In the present application, an embodiment will be described in a plurality of sections or the like when necessary for the sake of convenience. However, these sections or the like are not independent or separate from each other unless otherwise clearly specified, and one portion of an example corresponds to another detailed portion, another portion, an entire modification or the like, regardless of the order of the description. In addition, redundant descriptions of identical portions will be omitted in principle. Further, each of the components in the embodiment is not always indispensable unless otherwise clearly specified, it is theoretically limited to a given number or it is obvious from the context that the component is indispensable.

Likewise, in the description of the embodiment and the like, the wording such as "X made of A" used in association with a material, a composition or the like does not exclude a component that contains elements other than A unless otherwise clearly specified or it is obvious from the context that the material, the composition or the like only contains A. For example, "X made of A" used for a component means "X containing A as a main component" or the like. It is needless to say that, for example, a "silicon member" or the like is not limited to a member made of pure silicon but includes a member made of a SiGe (silicon-germanium) alloy or a multicomponent alloy containing silicon as a main component, and a member containing other additives and the like. In addition, a gold plating, a Cu layer, a nickel plating or the like is not limited to a member made of a pure component, and includes a member respectively containing gold, Cu, nickel or the like as a main component unless otherwise clearly specified.

Further, when referring to a specific numerical value or a quantity, the numerical value may be less than or greater than the specific numerical value unless otherwise clearly specified, it is theoretically limited to the specified value or it is obvious from the context that the value may not be less than or greater than the specified value.

In addition, in all of the drawings used to describe the embodiments, the same or identical portions are denoted by the same or similar symbols or reference signs, and redundant descriptions of the components are omitted in principle.

Further, in the accompanying drawings, hatched lines and the like are occasionally omitted even if the drawing is a cross section if the hatched lines make the drawings complicated or a difference between a member and a void is obvious. In this context, contour lines of a background are occasionally omitted even for a closed circle in plan view if it is obvious from the descriptions or the like. Furthermore, hatched lines or stippled dots are occasionally added even if the drawing is not a cross section in order to clarify that the portion is not a void or in order to clarify a boundary of a region.

In addition, in the present specification, a "semiconductor device" is a component that utilizes electrons in a semiconductor. Examples of the "semiconductor device" include a semiconductor chip and a semiconductor package in which the semiconductor chip is packaged. Therefore, the phrase "semiconductor device" encompasses the "semiconductor chip" and the "semiconductor package". In addition, a device in which a plurality of semiconductor devices is mounted on a wiring substrate, and in which the semiconductor devices are electrically connected to each other and modularized is referred to as an "electronic device". An electronic device may also be referred to as a semiconductor module. Note that the semiconductor device includes a plurality of stacked and packaged semiconductor chips including a plurality of memory chips.

<Electronic Device>

In the present embodiment, as an example of a semiconductor device in which a plurality of semiconductor chips is electrically connected via a wiring substrate, and an electronic device on which the above-described semiconductor device is mounted, an electronic device on which a semiconductor device (SoC (System on Chip)) and another semiconductor device in which a memory circuit connected to the SoC is formed are mounted will be described. The SoC is a semiconductor chip in which a system circuit constituting a computer system that includes a logic circuit is formed. There may be a case where the SoC itself includes a memory circuit. However, when a storage capacity of the memory circuit in the SoC is increased, the size of the SoC increases. Thus, even in a case where the SoC has a memory circuit, it is necessary for the SoC to communicate with an external memory component to process a large amount of data.

There are efforts to increase functionality of the electronic device described as an example in the present embodiment by adding various functions (systems) in a single device. In a case where the functionality of the electronic device is increased, it is necessary to increase the signal transmission path and stabilize power supply. On the other hand, there is a need to miniaturize the size of the electronic device. Thus, in the development of the electronic device, it is important to develop a technique to increase the signal transmission speed and to suppress an increase in the size of the electronic device.

In the electronic device comprising the plurality of systems as described above, a method in which the plurality of semiconductor devices (such as a semiconductor device for control and a semiconductor device for storage) having different functions is mounted on a motherboard, and in which the plurality of semiconductor devices is electrically connected by a wiring of the motherboard is considered. In the following description, an electronic device in which a semiconductor package comprising a logic circuit and a semiconductor package comprising a memory circuit are mounted on a wiring substrate as the motherboard is described. Note that, as a modification example, there may be a case where a technique described below is applied to a so-called Multi-Chip Module (MCM) in which the plurality of semiconductor chips is mounted on the wiring substrate.

Figure 1:
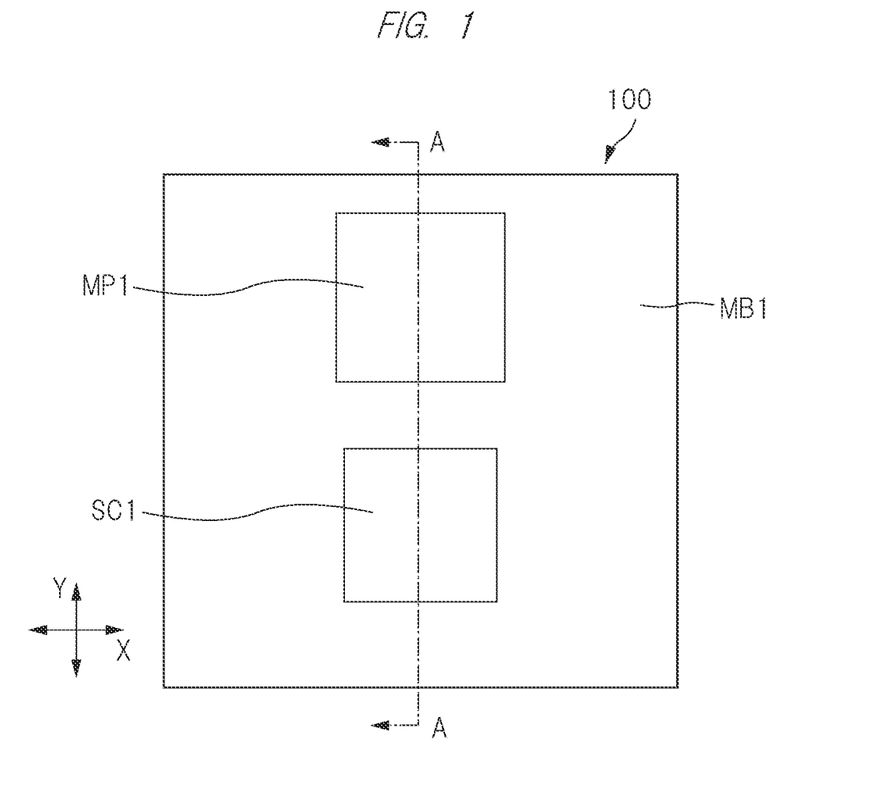
FIG. 1 is a plan view showing a top view layout of an electronic device of one embodiment.
Figure 2:
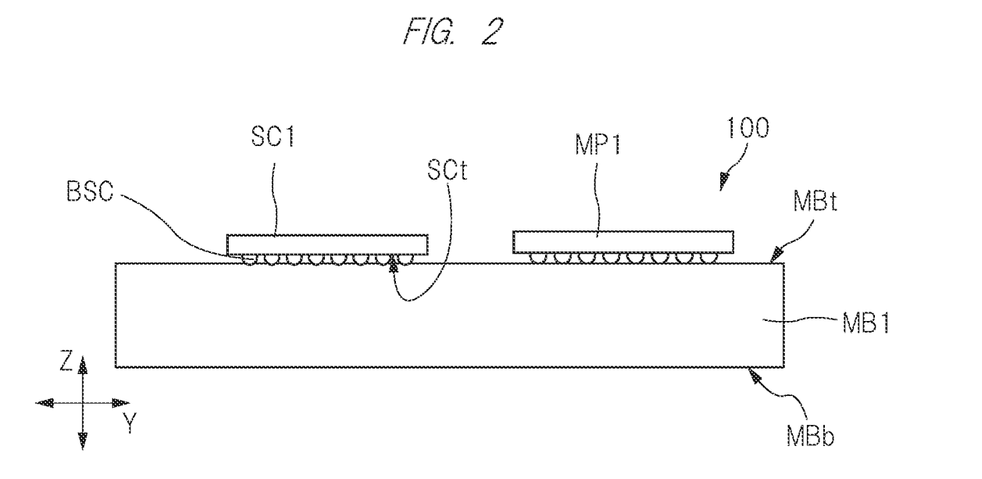
FIG. 2 is a cross-sectional view taken along a line A-A of FIG. 1.

FIG. 1 is a plan view showing a top view layout, of the electronic device of the present embodiment. FIG. 2 is a cross-sectional view taken along a line A-A of FIG. 1. The electronic device (electronic equipment) 100 shown FIG. 1 has a wiring substrate (motherboard, mounting substrate) MB1, a semiconductor device SC1 mounted on the wiring substrate MB1, and another semiconductor device MP1 mounted on the wiring substrate MB1. Note that the example shown in FIG. 1 is simplified for the sake of clarity. Thus, as a modification example, there may be a case where other electronic components not shown in FIG. 1 (such as a capacitor or a regulator for a power source) are mounted on the wiring substrate MB1. In addition, FIGS. 1 and 2 show an example in which one semiconductor device SC1 and one semiconductor device MP1 are mounted on the wiring substrate MB1. However, as a modification example, there may be a case where three or more semiconductor devices are mounted on the wiring substrate MB1. An example of such a case includes an embodiment or the like in which two or more semiconductor devices MP1 are connected to one semiconductor device SC1.

As shown in FIG. 2, the wiring substrate MB1 of the electronic device 100 has a main surface (surface, upper surface, semiconductor device mounting surface) MBt which is a mounting surface of the semiconductor device SC1, and a main surface (surface, lower surface) MBb on an opposite side of the main surface MBt.

Figure 3:
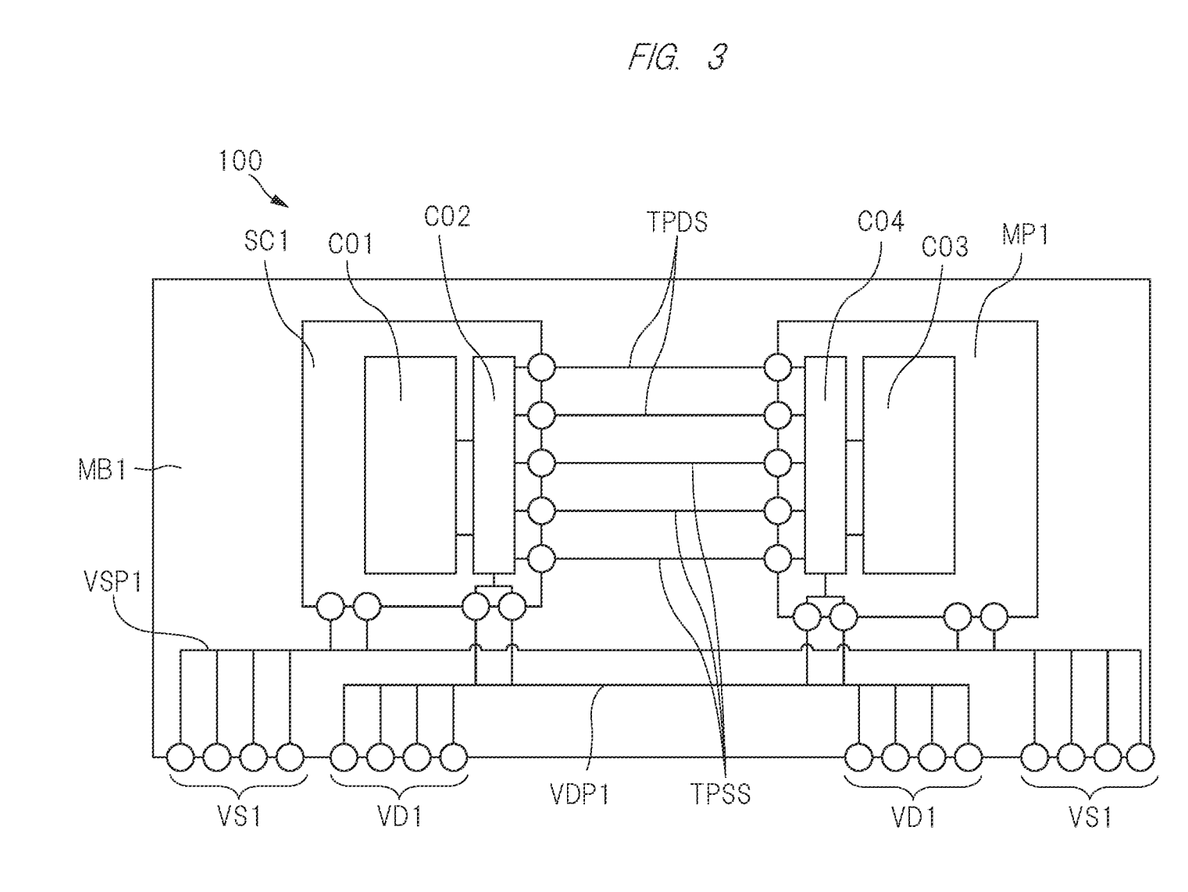
FIG. 3 is a circuit block diagram showing an example of an electrical connection relationship of the electronic device shown in FIG. 1.

FIG. 3 is a circuit block. diagram. showing an example of an electrical connection relationship of the electronic device shown in FIG. 1. As shown in FIG. 1, the semiconductor device SC1 has a logic circuit C01, and an input/output circuit C02 electrically connected to the logic circuit C01. In addition, the semiconductor device MP1 has a memory circuit C03, and an input/output circuit C04 electrically connected to the memory circuit C03. The semiconductor device SC1 and the semiconductor device MP1 are electrically connected via a plurality of signal transmission paths. The plurality of signal transmission paths includes a plurality of differential signal transmission paths TPDS to which differential signals are transmitted, and a plurality of signal transmission paths TPSS to which single-ended electrical signals are transmitted. In addition, a power source potential VD1 and a reference potential VS1 are supplied to each of the semiconductor device SC1 and the semiconductor device MP1. FIG. 3 shows a supply path of the power source potential VD1 among the various types of power source potentials supplied to the semiconductor device SC1 and the semiconductor device MP1. The supply path is used in both the semiconductor device SC1 and the semiconductor device MP1. The power source potential VD1 is utilized as, for example, the power for inputting and outputting signals in the semiconductor device SC1 and the semiconductor device MP1. Thus, in the example shown in FIG. 3, a supply path VDP1 of the power source potential VD1 is connected to the input/output circuit C02 of the semiconductor device SC1 and the input/output circuit C04 of the semiconductor device MP1. The reference potential VS1 is, for example, a ground potential, and is utilized in various circuits of the semiconductor device SC1 and the semiconductor device MP1. In FIG. 3, a supply path VSP1 of the reference potential VS1 in each of the semiconductor devices SC1 and MP1 is connected to each of the plurality of circuits (including the logic circuit C01, the input/output circuit C02, the memory circuit C03 and the input/output circuit C04) of the semiconductor device SC1 and the semiconductor device MP1, although not shown.

The electronic device 100 has a large number of differential signal transmission paths TPDS and signal transmission paths TPSS. FIG. 3 schematically shows two differential signal transmission paths TPDS and three signal transmission paths TPSS for the sake of clarity. The number of signal transmission paths TPSS is greater than that of the differential signal transmission paths TPDS.

The semiconductor device MP1 is, for example, a memory package conforming to the JEDEC standard called "LPDDR (Low Power Double Data Rate) 5". One of the features of the LPDDR5 standard is that a WCK signal is added in addition to a DQS signal (data strobe signal) as a signal for controlling a data input/output timing. Thus, the number of differential signal transmission paths required for a 64-bit operation is 20 pairs instead of the conventional 12 pairs. In detail, the number of transmission paths required by the LPDDR5 as the differential signal transmission paths is four pairs of differential signal wirings for CK signals (command address clock signals) which are signals for controlling timings of command signals and address signals, eight pairs for DQS signals, and eight pairs for WCK signals. In addition to the differential signal transmission paths described above, signal transmission paths for DQ signals (data signals), DM signals (data mask signals), command signals and address signals are required as single-ended transmission paths. It is necessary that the number of single-ended signal transmission paths is greater than that of the differential signal transmission paths. For example, when a bus width is 64 bits, 64 signal transmission paths for the DQ signals are required.

Since the semiconductor device SC1 performs data transmission with the semiconductor device MP1, the semiconductor device SC1 also comprises transmission paths conforming to the LPDDR5 standard. That is, for example, a signal transmission system of the semiconductor device SC1 operating at 64 bits comprises four pairs of differential signals wirings for CK signals, eight pairs for DQS signals, and eight pairs for WCK signals as differential signal transmission paths. In addition, the semiconductor device SC1 comprises signal transmission paths for DQ signals, DM signals (data mask signals), command signals, address signals and the like as single-ended transmission paths, in addition to the above-described differential signal transmission paths.

Thus, when suppressing an increase in product size (physical mounting area) in the semiconductor device SC1 requiring a large number of signal transmission paths, an arrangement density of the signal transmission paths increases. In addition, in order to suppress an incorrect operation in the large number of signal transmission paths, it is necessary to stabilize the power supply and to increase a cross-sectional area of the power supply path. Thus, it is necessary to increase the arrangement density of the signal transmission paths while suppressing a decrease in the cross-sectional area of the supply path of the power. In particular, in order to secure electrical connection reliability, a pattern with a large area relative to the wiring portion is necessary in a portion where an external terminal of the semiconductor device SC1 is arranged. Therefore, the inventors of the present application studied improvements on an external terminal arrangement as a part of a technological development to achieve stabilization of the power supply and an increase in the signal transmission path.

<SoC>

Figure 4:
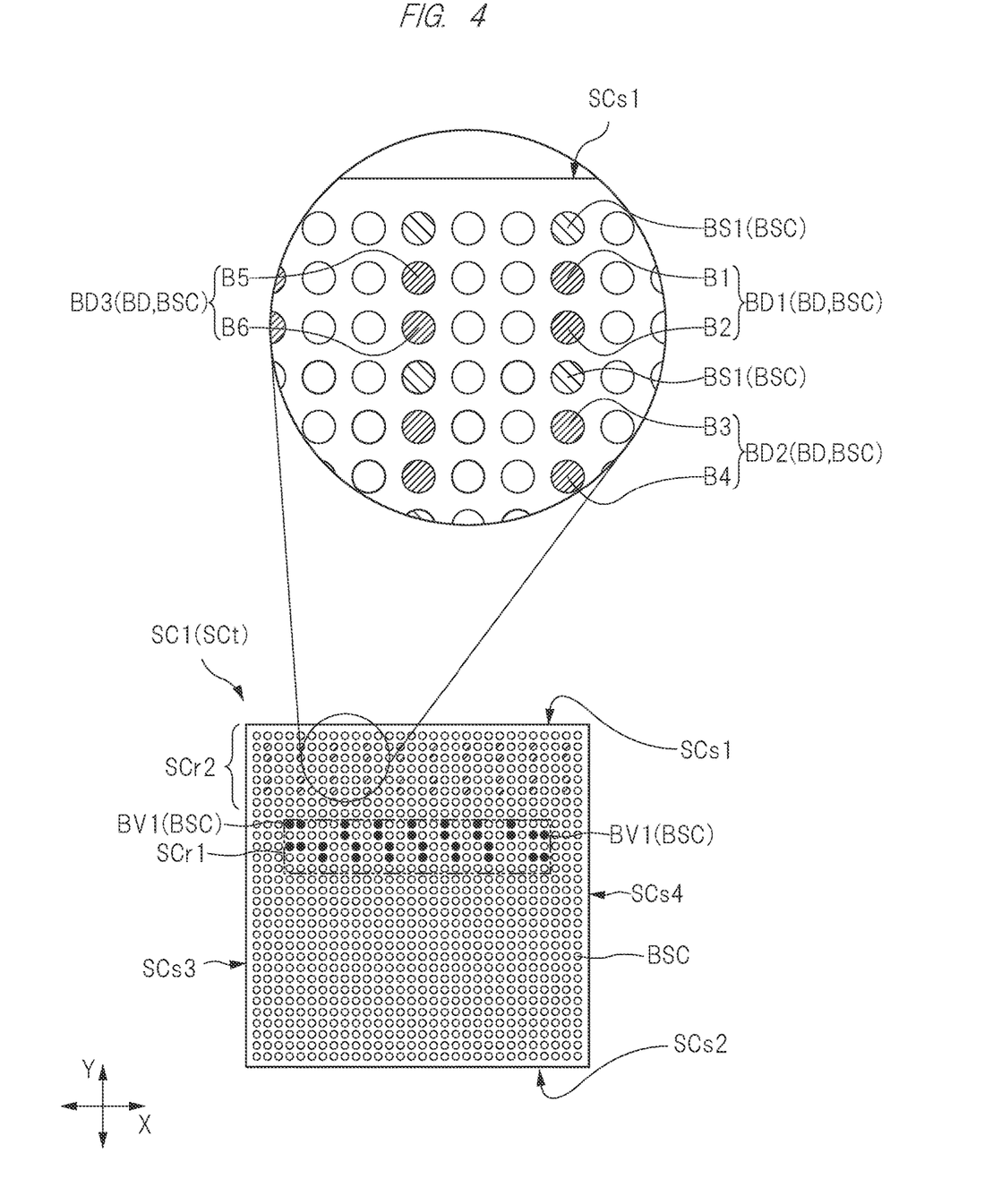
FIG. 4 is a plan view showing a terminal arrangement surface of an SoC (semiconductor device) shown in FIG. 1.
Figure 8:
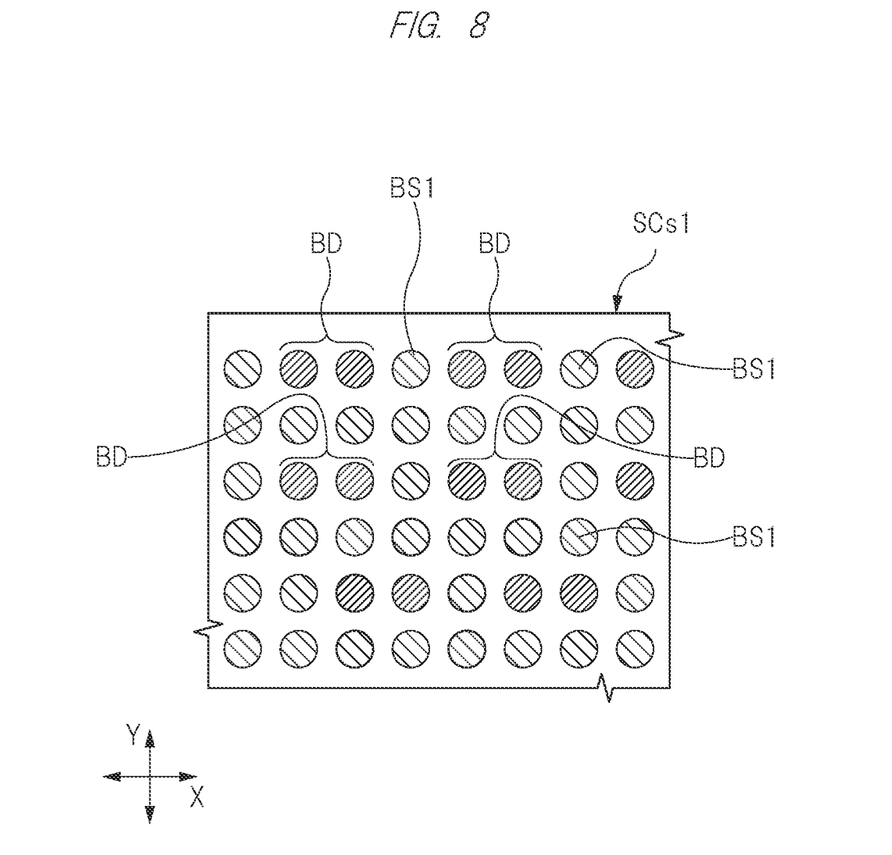
FIG. 8 is an enlarged plan view showing a study example with respect to FIG. 4.

First, the semiconductor device SC1 shown in FIG. 1 will be described. FIG. 4 is a plan view showing a terminal arrangement surface of the SoC (semiconductor device) shown in FIG. 1. FIG. 8 is an enlarged plan view showing a study example with respect to FIG. 4. In FIGS. 4 and 8, the differential pair terminals, power source terminals and reference potential terminals are indicated by hatched lines or black patterns that differ from each other to identify these terminals.

The semiconductor device SC1 has a main surface (surface) SCt which is the terminal arrangement surface on which a plurality of terminals BSC is arranged. As shown in FIG. 2, in the electronic device 100, the main surface SCt faces the main surface (surface) MBt which is the mounting surface of the wiring substrate MB1. As shown in FIG. 4, the main surface SCt has a side SCs1 extending in an X direction, a side SCs2 on an opposite side of the side SCs1, a side SCs3 intersecting the side SCs1 and the side SCs2 and extending in a Y direction orthogonal to the X direction, and a side SCs4 on an opposite side of the side SCs3. In the main surface SCt, the side SCs1 is a side facing the semiconductor device MP1 (see FIG. 1).

The terminals BSC of the main surface SCt are arranged in a matrix-like manner in the main surface SCt. The plurality of terminals BSC is, for example, a solder ball or a pillar-like electrode (pillar electrode). The plurality of terminals BSC includes a plurality of differential pair terminals BD electrically connected to the semiconductor device MP1 (see FIG. 3) and to which differential signals are transmitted. In addition, the plurality of terminals BSC includes a reference potential terminal BS1 to which the reference potential VS1 is supplied (see FIG. 3), and a power source terminal BV1 to which the power source potential VD1 is supplied (see FIG. 3).

The semiconductor device SC1 is a semiconductor comprising a circuit that includes a plurality of semiconductor elements formed on a substrate made of, for example, silicon. In general, a plurality of external terminals of the semiconductor chip is arranged in a peripheral region of a terminal formation surface. As a method of arranging the plurality of terminals BSC in a matrix-like manner on the main surface SCt, for example, there is a method of forming a rewiring layer on the terminal formation surface of the semiconductor chip, and rewiring the rewiring layer such that the portions of the rewiring layer that become the terminals BSC are arranged in a matrix-like manner as shown in FIG. 4. Alternatively, there is a method of mounting and packaging the SoC on an interposer substrate (not shown), and using a terminal formation surface of the interposer substrate as the main surface SCt.

In the present embodiment, in order to improve the arrangement density of the terminals BSC in the main surface SCt, the terminals BSC are arranged at a narrow pitch. For example, a distance between centers of the terminals BSC adjacent to each other is approximately 0.5 mm to 0.8 mm.

In addition, the main surface SCt comprises a region SCr1 in which the plurality of power source terminals BV1 is arranged, and a region SCr2 arranged between the side SCs1 and the region SCr1. In addition to the plurality of differential pair terminals BD, the plurality of reference potential terminals BS1, a single-ended signal terminal (such as a DQ signal terminal, a command signal terminal or an address signal terminal) and the like are arranged in the region SCr2. Thus, the signal terminals BSC electrically connected to the semiconductor device MP1 are collectively arranged in the region SCr2 of the main surface SCt where a distance to the semiconductor device MP1 is short (see FIG. 1). On the other hand, the power source terminal BV1 is arranged in the region SCr1 where the distance to the semiconductor device MP1 is longer than the region SCr2. In the present embodiment, as shown in FIG. 4, the region SCr1 is a center portion of the main surface SCt, and the region SCr2 is peripheral portion of the main surface SCt.

In addition, the plurality of differential pair terminals BD includes a differential pair terminal BD1 constituted by a pair of terminals B1 and B2 arranged along the Y direction, and a differential pair terminal BD2 constituted by a pair of terminals B3 and B4 arranged along the Y direction. The differential pair terminal BD1 and the differential pair terminal BD2 among the plurality of differential pair terminals BD are arranged so as to be adjacent to each other in the Y direction.

When the distance between the plurality of differential pair terminals BD and the semiconductor device MP1 (see FIG. 1) is to be minimized, a method of collectively arranging the plurality of differential pair terminals BD a first row closest to the side SCs1 is considered. However, the inventors of the present application have found through studies that the method of collectively arranging the plurality of differential pair terminals BD in the first row closest to the side SCs1 has room for improvement in relation to the transmission path for a signal other than the differential signal, or in relation to the power supply path. As described with reference to FIG. 3, the power source potential VD1 is used (shared) by both the semiconductor device SC1 and the semiconductor device MP1. In order to stabilize the power supply of the power source potential VD1, it is preferable that a large-area conductor plane electrically connecting the semiconductor device SC1 and the semiconductor device MP1 and to which the power source potential VD1 is supplied is provided close to the semiconductor device SC1 and the semiconductor device MP1. In addition, among the power source potential supplied to the semiconductor device MP1, the power source potential VD1 which is the power for inputting and outputting signals has a low potential relative to other power source potentials (such as the power source potential for driving a memory cell constituting the memory circuit). If such a relatively low potential is not stably supplied, there is a risk that the input/output circuit C04 shown in FIG. 3 cannot be operated normally. Therefore, as described above, it is preferable that the power source potential VD1 is used (shared) by both the semiconductor device SC1 and the semiconductor device MP1. In other words, it is preferable that the terminal which is the supply path of the power source potential (such as for the input/output circuit C04) of the semiconductor device MP1 and the terminal of the semiconductor device SC1 to which the same potential as the power source potential is supplied are electrically connected to each other. Further, it is preferable that a length of the path (conductor plane) connecting the two terminals described above to each other short as possible. However, as shown in FIG. 8 as the study example, in a case where the differential pair terminals BD are arranged at a narrow pitch in the first row closest to the side SCS1 (specifically, in a case where each pair of the differential pair terminals BD described above is arranged along the X direction), it is difficult to arrange the conductor plane for the power source potential VD1 extending so as to connect each of the semiconductor device SC1 and the semiconductor device MP1. That is, it is difficult to shorten the length of the path for the above-described power source potential VD1.

Therefore, in the case of the present. embodiment, in the region SCr2 extending along the side SCs1, the terminal BSC other than the differential pair terminals BD is arranged between the differential pair terminals BD adjacent to each other in the X direction. In a case where some of the plurality of differential pair terminals BD are arranged along the Y direction, the number of the differential pair terminals BD arranged along the X direction can be reduced. In other words, in a case where some of the plurality of differential pair terminals BD are arranged along the Y direction, a space can be provided between the differential pair terminals BD adjacent to each other in the X direction. As described in detail below, when a space is provided between the differential pair terminals BD adjacent to each other in the main surface SCt, a space can be provided between differential signal through-hole wirings adjacent to each other in the wiring substrate MB1 (see FIG. 1). In the present embodiment, this space is utilized to arrange a power source plane for the power source potential VD1 (large-area conductor pattern for the power source potential VD1).

In addition, the terminal BSC other than the plurality of differential pair terminals BD is arranged between the differential pair terminals BD adjacent to each other in the X direction. For example, in the example shown in FIG. 4, the plurality of differential pair terminals BD includes a differential pair terminal BD3 constituted by a pair of terminals B5 and 36 arranged along the Y direction, the differential pair terminal BD3 being arranged so as to be adjacent to the differential pair terminal BD1 in the X direction. A terminal other than the plurality of differential pair terminals BD is arranged between the differential pair terminal BD1 and the differential pair terminal BD3. Examples of the terminal BSC other than the differential pair terminals BD include the single-ended signal terminal BSC such as the DQ signal terminal, the command signal terminal and the address signal terminal, in addition to the reference potential terminal BS1. Thus, the space between the differential pair terminals BD adjacent to each other in the X direction is utilized as an arrangement space of the terminal other than the differential pair terminals BD to effectively utilize the space.

<Wiring Substrate>

Figure 5:
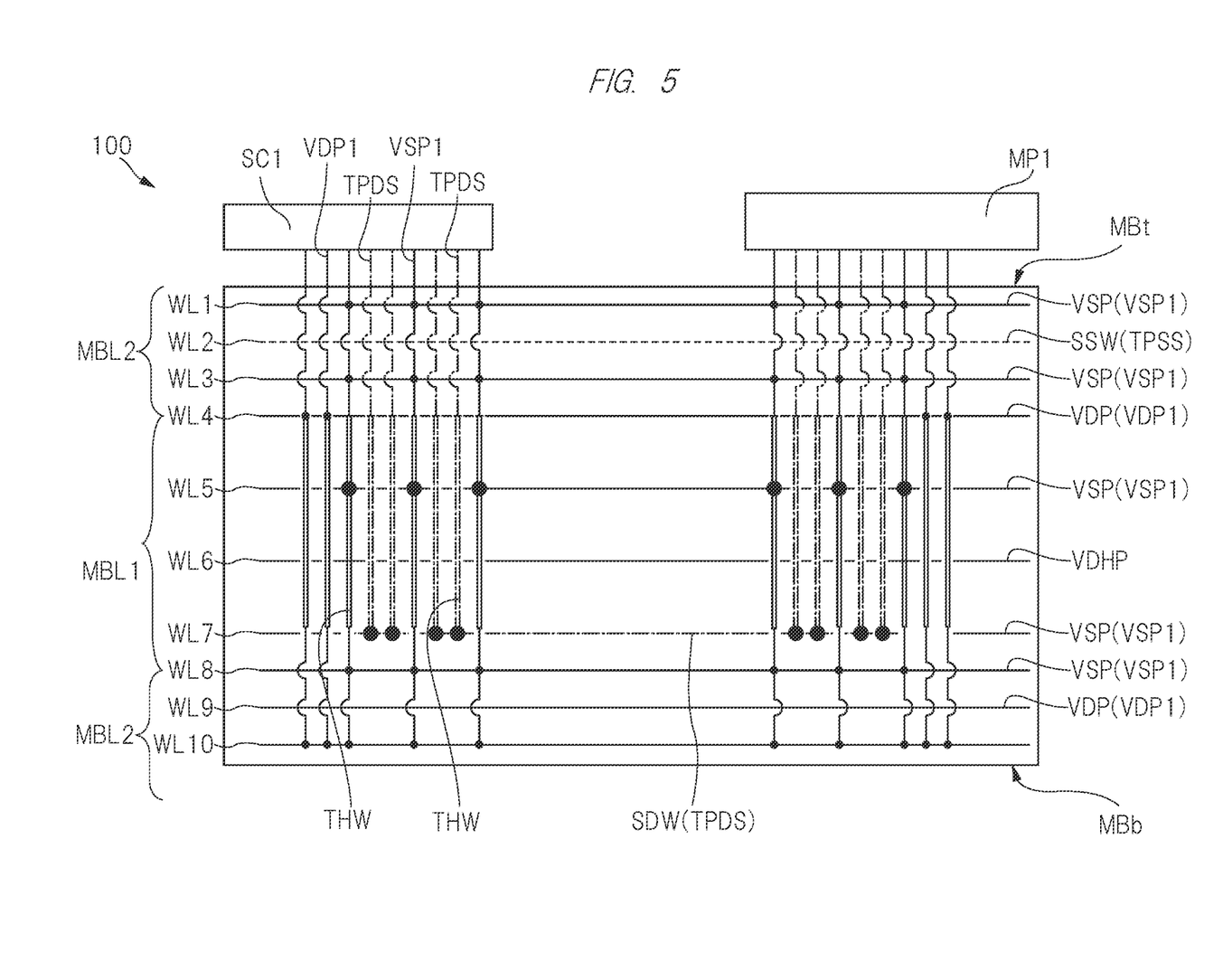
FIG. 5 is an explanatory view schematically showing a configuration example of a plurality of wiring layers of a wiring substrate shown in FIG. 2, and an example of a connection relationship between the wiring and a conductor pattern mainly arranged in each of the wiring layers.

Next, a configuration example of the wiring substrate MB1 shown in FIGS. 1 to 3 will be described. FIG. 5 is an explanatory view schematically showing a configuration example of the plurality of wiring layers of the wiring substrate shown in FIG. 2, and an example of a connection relationship between the wiring and the conductor pattern mainly arranged in each of the wiring layers. In FIG. 5, the differential signal transmission paths TPDS to which differential signals are transmitted are indicated by dot-and-dash lines, and the signal transmission paths TPSS to which single-ended electrical signals are transmitted are indicated by dotted lines. In addition, in FIG. 5, through-hole wirings THW penetrating the plurality of wiring layers are indicated by double lines.

The wiring substrate MB1 shown in FIG. 5 comprises 10 wiring layers constituted by wiring layers WL1, WL2, WL3, WL4, WL5, WL6, WL7, WL8, WL9 and WL10. The wiring substrate MB1 comprises a structure in which two types of substrates having different manufacturing methods overlap each other. Each of the layers from the wiring layer WL4 to the wiring layer WL7 is a base material layer MBL1 that collectively forms the plurality of wiring layers. The base material layer MBL1 uses the through-hole wiring THW for the electrical connection between the wiring layers. Each of the layers from the wiring layer WL1 to the wiring layer WL3, and each of the layers from the wiring layer WL8 to the wiring layer WL10 is a build-up layer MBL2 formed by a build-up method in which hole-drilling, conductor pattern formation including the wiring, and the like are repeated for each layer. In the build-up layer MBL2, the wiring layers are electrically connected via a via wiring (not shown).

Since the wiring substrate MB1 comprises a large number of signal transmission paths, the conductor pattern of the wiring substrate MB1 including the wiring, the terminals, the power source plane, a ground plane and the through-hole wiring is arranged in accordance with fine design rules. For example, a width of the wiring pattern (length in a direction orthogonal to an extension direction) is approximately 65 µm to 100 µm. A separation distance between the conductor patterns adjacent to each other and electrically separated from each other is approximately 75 µm to 100 µm. A distance between centers of the through-hole wirings adjacent to each other is approximately 650 µm to 800 µm. In addition, in the base material layer MBL1, a land pattern formed as a portion of the through-hole wiring THW is formed in each of the wiring layers WL4 to WL7. A diameter of the land pattern of the through-hole wiring THW is, for example, approximately 450 µm to 500 µm. Thus, a separation distance between the land patterns of the through-hole wirings THW adjacent to each other is approximately 200 µm to 300 µm.

The wiring substrate MB1 is a motherboard on which a plurality of electronic components is mounted and which electrically connects these electronic components. Thus, the wiring substrate MB1 is required to be strong enough to support the plurality of electronic components mounted thereon. In the case of a method in which the through-hole wiring THW penetrating the base material layer MBL1 in the thickness direction is provided, since a strong material such as a prepreg containing glass fibers can be used for an insulating layer constituting the base material layer MBL1, the strength of the wiring substrate MB1 can be improved. In addition, since the plurality of through-hole wirings THW is collectively formed, manufacturing efficiency of the wiring substrate can be improved relative to the case where all of the wiring layers of the wiring substrate MB1 are formed by the build-up method. On the other hand, in the case of the build-up method, since each of the wiring layers and a via wiring that connects the wiring layers are formed in this order, the manufacturing process becomes complicated. However, the via wirings can be arranged on each of the wiring layers at positions that differ from each other plan view. Thus, the build-up layer MBL2 has a higher degree of freedom in design relative to the base material layer MBL1. In the case of the present embodiment, the base material layer MBL1 and the build-up layer MBL2 are combined to improve the strength of the wiring substrate MB1 while improving the degree of freedom in design.

The electronic device 100 shown in FIG. 3 has a large number of signal transmission paths, and each of the large number of signal transmission paths is transmitted at a high frequency. Thus, in order to suppress mutual interference of each of the signal transmission paths, each of the large number of signal transmission paths is wired in, for example, a microstripline structure in the wiring substrate MB1. In the case of the microstripline structure, for example, the conductor planes (large-area conductor patterns) are provided in an upper layer and a lower layer of one signal layer (wiring layer in which the signal wiring is arranged), and a fixed potential such as the reference potential VS1 or the power source potential VD1 is supplied to each of the conductor planes. In this manner, it is possible to suppress a spread of electromagnetic waves caused by high frequency signals flowing in each of the large number of signal transmission paths.

As shown in FIG. 5, a ground plane (large area conductor pattern, ground pattern, reference potential pattern) VSP is mainly arranged in the wiring layer WL1 closest to each of the semiconductor devices SC1 and MP1 in a Z direction which is the thickness direction of the wiring substrate MB1. The ground plane VSP is a portion of the supply path VSP1 of the reference potential VS1 (see FIG. 3). In addition, a plurality of pads (substrate terminals) connected to the plurality of terminals BSC of the semiconductor device SC1 is arranged in the wiring layer WL1 (see FIG. 4), in addition to the ground plane VSP. The ground plane VSP is mainly arranged in each of the wiring layer WL3, the wiring layer WL5 and the wiring layer WL8, in addition to the wiring layer WL1.

A conductor pattern connected to a supply source of the power source potential and the reference potential is arranged in the wiring layer WL10. Although not shown in FIG. 5, each of the supply path VSP1 of the reference potential, the supply path VDP1 of the power source potential and a power source plane (large-area conductor pattern, power source pattern) VDHP is electrically connected to a power source component (such as a regulator) mounted on a side of the wiring layer WL10. In the case of the electronic device 100 shown in FIG. 5, each of the supply paths VSP1 for the reference potential formed in each of the wiring layers WL1, WL3, WL5, WL7 and WL8, and each of the supply paths VDP1 for the power source potential formed in each of the wiring layers WL4 and WL9 is electrically connected to the conductor pattern formed in the wiring layer WL10. The power source potential or the reference potential supplied from the power source component such as the regulator (not shown) flows to the supply paths VSP1 and VDP1 formed in each of the wiring layers via the conductor pattern formed in the wiring layer WL10.

A signal wiring SSW to which the single-ended signal is transmitted is mainly arranged in the wiring layer WL2 and the wiring layer WL4. In addition, a differential signal wiring SDW to which the differential signal is transmitted is mainly arranged in the wiring layer WL7. The signal transmission path TPSS for the single-ended signal and the transmission path TPDS for the differential signal are arranged in the wiring layers that differ from each other. This increases the degree of freedom of the wiring layout, and allows a large number of wirings to be arranged in high density. Since the number of signal transmission paths TPSS for the single-ended signals is greater than that of the transmission paths TPDS for the differential signals, a majority of the signal wirings SSW are formed in the wiring layer WL2 that includes the build-up layer MBL2 having a high degree of freedom in design. FIG. 5 shows a power source plane VDP arranged in the wiring layer WL4. However, as described below with reference to FIG. 6, the signal wiring SSW that cannot be arranged in the wiring layer WL2 is arranged in the wiring layer WL4, in addition to the power source plane VDP. In addition, a majority of the differential signal wirings SDW (including a case of all of the differential signal wirings SDW of the wiring substrate MB1) are formed in the wiring layer WL7 that includes the base material layer MBL1.

In addition, the power source plane (large-area conductor pattern, power source pattern) VDP is mainly arranged in the wiring layer WL4. The power source plane VDP of the wiring layer WL4 is a portion of the supply path VDP1 of the power source potential VD1 (see FIG. 3). Considering a stable supply of the power in the semiconductor device SC1, it is preferable to arrange the power source plane VDP in the vicinity of the semiconductor device SC1. Therefore, in the case of the present embodiment, the power source plane VDP is arranged in the wiring layer WL4. Details of a layout of the wiring layer WL4 will be described below. In addition, the power source plane VDP having a larger area than the wiring layer WL4 is arranged in the wiring layer WL9. By arranging the power source plane VDP in each of the wiring layer WL4 and the wiring layer WL9, the power source potential VD1 can be stabilized relative to the case where the power source plane VDP is arranged in. either one of the wiring layer WL4 and the wiring layer WL9 (see FIG. 3).

In addition, the power source plane VDHP is mainly arranged in the wiring layer WL6. A power source potential (second power source potential) that differs from the power source potential VD1 shown in FIG. 3 is supplied to the power source plane VDHP of the wiring layer WL6. The second power source potential is utilized as, for example, a core power source for the logic circuit C01 of the semiconductor device SC1 shown in FIG. 3, or a core power source for the memory circuit C03 of the semiconductor device MP1. Note that, although FIG. 5 shows one power source plane VDHP, there may be a case where several types of power source potentials having potentials that differ from each other are supplied to the semiconductor device SC1 and the semiconductor device MP1. In this case, the power source plane VDHP may be a plurality of electrically separated power source planes.

Figure 6:
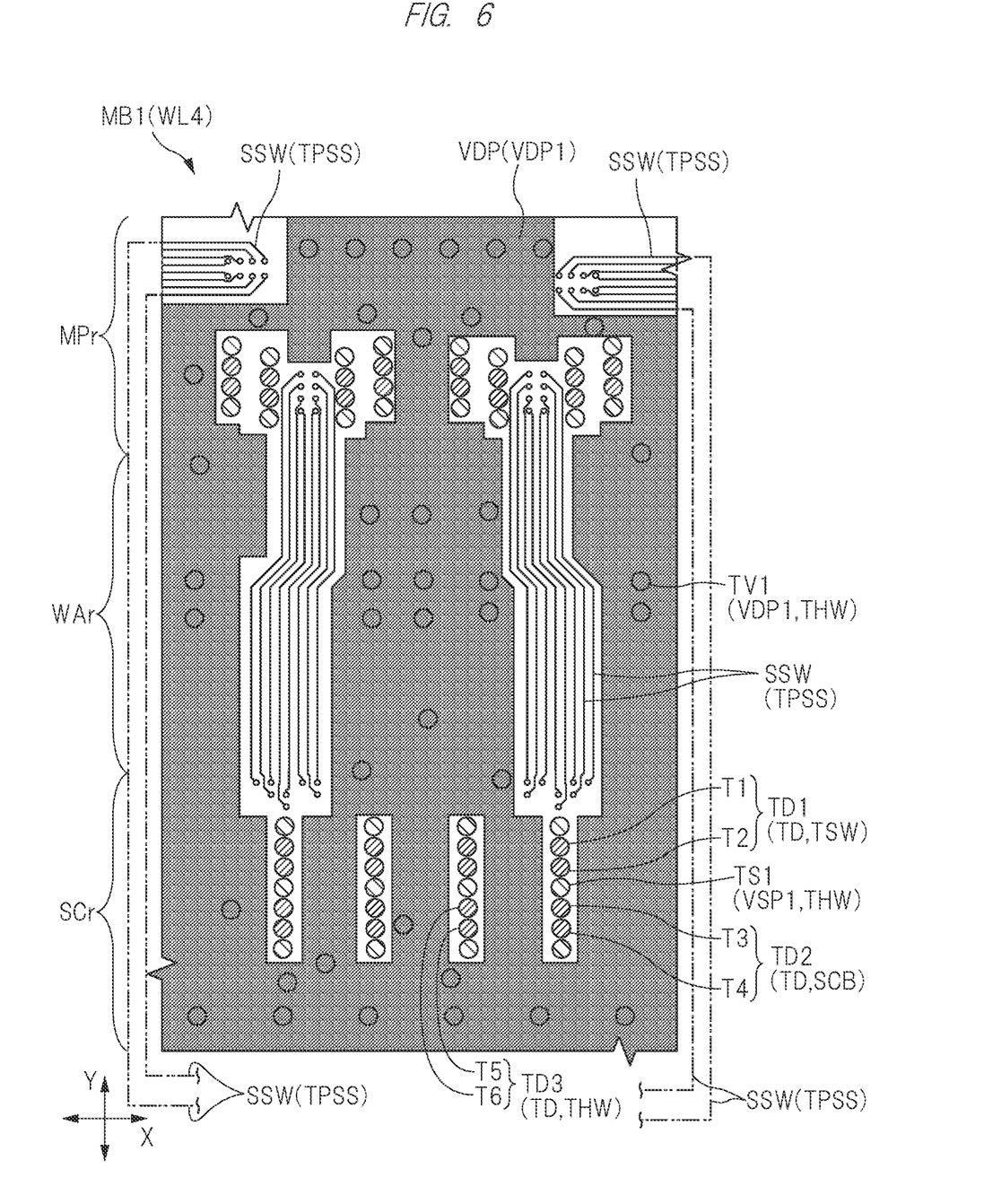
FIG. 6 is an enlarged plan view showing a layout example of the conductor pattern in a fourth wiring layer of the wiring substrate shown in FIG. 5.
Figure 7:
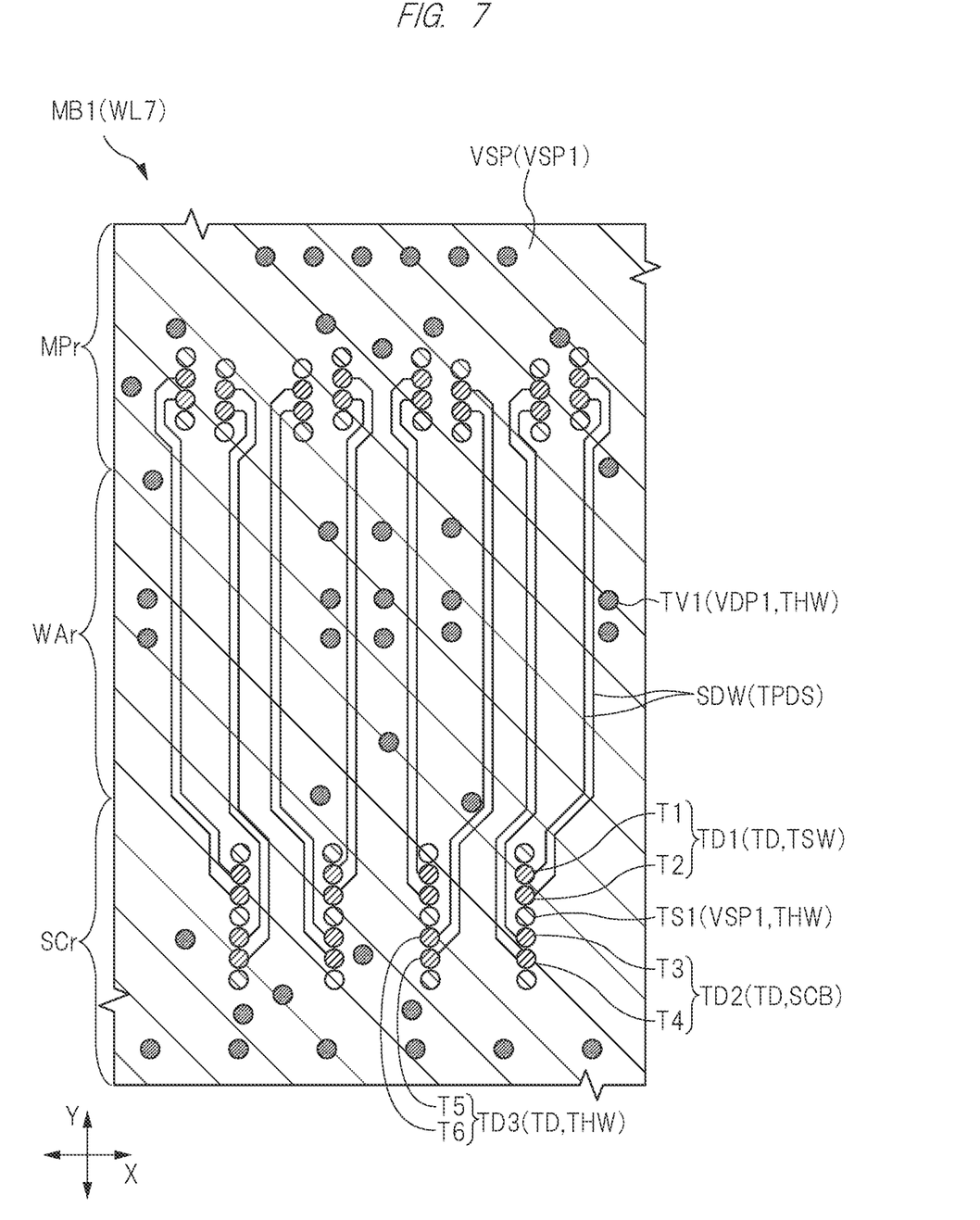
FIG. 7 is an enlarged plan view showing a layout example of the conductor pattern in a seventh wiring layer of the wiring substrate shown in FIG. 5.

Next, the wiring layer WL4 among the plurality of wiring layers of the wiring substrate MB1 shown in FIG. 5 in which the power source plane VDP is arranged will be described. FIG. 6 is an enlarged plan view showing a layout example of the conductor pattern in a fourth wiring layer of the wiring substrate shown in FIG. 5. FIG. 7 is an enlarged plan view showing a layout example of the conductor pattern in a seventh wiring layer of the wiring substrate shown in FIG. 5. Note that, in FIG. 6, some of the plurality of signal transmission paths TPSS are indicated by a two-dot chain line in order to clearly show that some of the signal transmission paths TPSS are arranged so as to surround a periphery of the power source plane VDP.

As shown in FIG. 6, the power source plane VDP, the plurality of signal wirings SSW and the plurality of through-hole wirings THW are arranged in the wiring layer WL4. In plan view, each of the wiring layer WL4 and the wiring layer WL7 shown in FIG. 7 includes a region SCr overlapping the semiconductor device SC1 (see FIG. 1), and a region MPr overlapping the semiconductor device MP1 (see FIG. 1). The plurality of signal wirings SSW extends so as to connect the region SCr and the region MPr in the wiring layer WL4. In detail, some of the plurality of signal wirings SSW (such as the transmission paths of the command signal and the address signal) linearly extend along the Y direction. In addition, some of the remaining signal wirings SSW (such as the transmission paths that transmit the DQ signals) are arranged so as to go around the periphery of the power source plane VDP and connect the region SCr and the region MPr.

In addition, the plurality of through-hole wirings THW includes a plurality of differential pair through-hole wirings TD electrically connected to the semiconductor device MP1 (see FIG. 3) and to which differential signals are transmitted.

In addition, the plurality of through-hole wirings THW includes a reference potential through-hole wiring TS1 to which the reference potential VS1 is supplied (see FIG. 3), and a power source through-hole wiring TV1 to which the power source potential VD1 is supplied (see FIG. 3). The power source through-hole wirings TV1 are electrically connected to each other via the power source plane VDP. In addition, the reference potential through-hole wirings TS1 are electrically connected to each other via the ground plane VSP arranged in the wiring layer WL5 shown in FIG. 5. In addition, the plurality of differential pair through-hole wirings TD is connected to the differential signal wiring SDW in the wiring layer WL7 shown in FIG. 7.

As shown in FIG. 7, the plurality of differential signal wirings SDW extends so as to connect the region SCr and the region MPr in the wiring layer WL7. In detail, at least some of the plurality of signal wirings (such as DQS signals or WCK signals) SDW linearly extend along the Y direction. In other words, the wiring layer WL7 has an intermediate region WAr between the region SCr and the region MPr. The differential signal wiring SDW extends from one of the region SCr and the region MPr toward the other of the region SCr and the region MPr via the intermediate region WAr. The ground plane VSP is arranged in a periphery of the differential signal wiring SDW. Since the through-hole wiring THW is formed so as to penetrate the plurality of wiring layers, the plurality of through-hole wirings THW arranged in the wiring layer WL7 shown in FIG. 7 and the plurality of through-hole wirings THW arranged in the wiring layer WL4 shown in FIG. 6 are each arranged at the same position (position overlapping in the thickness direction). Thus, in the wiring layer WL4 shown in FIG. 6, since it is necessary to consider the layout of the through-hole wiring THW, the wiring layout has a lower degree of freedom relative to each of the wiring layers WL1 to WL3 shown in FIG. 5.

Here, as shown in FIGS. 6 and 7, the plurality of differential pair through-hole wirings TD includes a differential pair through-hole wiring TD1 constituted by a pair of through-hole wirings T1 and T2 arranged along the Y direction, and a differential pair through-hole wiring TD2 constituted by a pair of through-hole wirings T3 and T4 arranged along the Y direction. The differential pair through-hole wiring TD1 and the differential pair through-hole wiring TD2 are arranged along the Y direction.

The layout of the plurality of differential pair through-hole wirings TD shown in FIGS. 6 and 7 is the same as the layout of the plurality of differential pair terminals BD described with reference to FIG. 4. In the case of the present embodiment, since the differential pair terminal BD1 and the differential pair terminal BD2 are arranged along the Y direction in the main surface SCt of the semiconductor device SC1 as shown in FIG. 4, it is easier to arrange the differential pair through-hole wiring TD1 and the differential pair through-hole wiring TD2 such that they are aligned along the Y direction as shown in FIG. 6. By arranging the layout of the plurality of terminals BSC of the semiconductor device SC1 shown in FIG. 4 based on the same rules as the layout of the plurality of through-hole wirings THW in the wiring layer WL4 shown in FIG. 6, the layout of the through-hole wiring THW shown in FIG. 6 can be obtained without causing the wiring to be drawn in the wiring layers WL1 to WL3 (see FIG. 5).

By arranging the differential pair through-hole wirings TD1 and TD2 along the Y direction, an exclusive area of the differential air through-hole wiring TD in the X direction can be reduced. For example, the plurality of differential pair through-hole wirings TD includes a differential pair through-hole wiring TD3 constituted by a pair of through-hole wirings T5 and T6 arranged along the Y direction, the differential pair through-hole wiring TD3 being arranged so as to be adjacent to the differential pair through-hole wiring TD1 in the X direction. A portion of the power source plane VDP is arranged between the differential pair through-hole wiring TD1 and the differential pair through-hole wiring TD3. In other words, in the case of the present embodiment, a space obtained by arranging the differential pair through-hole wirings TD1 and TD2 along the Y direction is utilized to arrange the supply path of the power source potential VD1 (see FIG. 3).

As described with reference to FIG. 3, the power source potential VD1 is supplied to each of the semiconductor device SC1 and the semiconductor device MP1. Thus, it is preferable that the power source plane VDP provided to strengthen the supply path of the power source potential. VD1 extends so as to connect the region SCr and the region MPr as shown in FIGS. 6 and 7. As shown in FIG. 6, the plurality of signal transmission paths TPSS that transmits single-ended signals is arranged in the wiring layer WL4. Some of the plurality of signal transmission paths TPSS are arranged so as to surround the periphery of the power source plane VDP. In the case of the present embodiment, since the power source plane VDP is arranged between the differential pair through-hole wirings TD adjacent to each other in the X direction, the power source plane VDP is not divided in the middle in the Y direction in plan view. This layout allows the power source plane VDP to be arranged in the wiring layer WL4 so as to connect the region SCr and the region MPr.

In addition, in the case of the example shown in FIG. 6, the plurality of signal wirings SSW is arranged in a region surrounded by the power source plane VDP. The plurality of signal wirings SSW arranged in the region surrounded by the power source plane VDP extends from one of the region SCr and the region MPr toward the other of the region SCr and the region MPr along the Y direction.

In addition, as shown in FIG. 4, some of the plurality of reference potential terminals BS1 are arranged between the differential pair terminals BD1 and the differential pair terminals BD2. FIG. 4 shows an example in which one reference potential terminal BS1 is arranged. Likewise, as shown in FIG. 6, some of the plurality of reference potential through-hole wirings TS1 (one in FIG. 6) are arranged between the differential pair through-hole wiring TD1 and the differential pair through-hole wiring TD2. Thus, the reference potential terminal BS1 (or reference potential through-hole wiring TS1) to which the reference potential is supplied is arranged between the differential pair terminals BD (or differential pair through-hole wirings TD) adjacent to each other in the Y direction to suppress a signal interference between the adjacent differential pairs. In addition, each of the reference potential terminal BS1 and the reference potential through-hole wiring TS1 is utilized as a reference of the differential signal transmission path TPDS.

In the foregoing, the invention made by the present inventors has been concretely described based on the embodiment. However, it is needless to say that the present invention is not limited to the foregoing embodiment, and various modifications and alterations can be made within the scope of the present invention.

(First Modification Example)

For example, in FIG. 4, an example in which the reference potential terminal BS1 (or reference potential through-hole wiring TS1) to which the reference potential is supplied is arranged between the differential pair terminals BD (or differential pair through-hole wirings TD) adjacent to each other in the Y direction has been described. However, instead of the reference potential terminal BS1 (or reference potential through-hole wiring TS1), the terminal BSC (or through-hole wiring THW) which is the transmission path for the single-ended signal may be arranged between the differential pair terminals BD (or differential pair through-hole wirings TD) adjacent to each other in the Y direction. Note that, in a case where the terminal (or through-hole wiring THW) which is the transmission path for the single-ended signal is arranged, this terminal cannot be utilized as a reference for the differential signal transmission path TPDS.

(Second Modification Example)

For example, in FIG. 4, an example in which two pairs of differential pair terminals BD1 and BD2 are arranged in the Y direction has been described. However, the number of differential pair terminals BD arranged in the Y direction is not limited to be two. For example, in a case of a semiconductor device in which the number of differential pair terminals BD required is even greater, three or more pairs of differential pairs may be arranged in the Y direction. Note that, as shown in FIG. 4, the plurality of power source terminals BV1 is arranged in the region SCr1 of the main surface SCt of the wiring substrate MB1. For this reason, it is preferable that the number of differential pair terminals arranged in the Y direction is three pairs or less, depending on the size of the wiring substrate MB1 (that is, the semiconductor device SC1) to be used.

What is claimed is:

1. An electronic device comprising:
a first semiconductor device having a logic circuit;
a second semiconductor device electrically connected to the first semiconductor device and having a memory circuit; and
a wiring substrate on which the first semiconductor device and the second semiconductor device are mounted,
wherein the first semiconductor device has:
  a first surface arranged so as to face the wiring substrate; and
  a plurality of terminals arranged on the first surface,
wherein the plurality of terminals includes:
  a plurality of differential pair terminals electrically connected to the second semiconductor device, differential signals being transmitted to the plurality of differential pair terminals, respectively;
  a plurality of reference potential terminals, wherein a reference potential is to be supplied to each of the plurality of reference potential terminals; and
  a plurality of first power source terminals, wherein a first power source potential is to be supplied to each of the plurality of first power source terminals,
wherein the first surface includes:
  a first side extending in a first direction;
  a first region in which the plurality of first power source terminals is arranged; and
  a second region arranged between the first side and the first region,
wherein, in the second region, the plurality of differential pair terminals is arranged along the first side,
wherein the plurality of differential pair terminals includes:
  a first differential pair terminal constituted by a pair of terminals arranged along a second direction orthogonal to the first direction;
  a second differential pair terminal constituted by a pair of terminals arranged along the second direction; and a third differential pair terminal constituted by a pair of terminals arranged along the second direction, and arranged so as to be adjacent to the first differential pair terminal in the first direction, wherein the first differential pair terminal and the second differential pair terminal among the plurality of differential pair terminals are arranged so as to be adjacent to each other in the second direction, wherein a terminal other than the plurality of differential pair terminals is arranged between the first differential pair terminal and the third differential pair terminal, wherein the wiring substrate has a plurality of wiring layers, wherein a first wiring layer among the plurality of wiring layers has:
 a first power source pattern which is a conductor pattern, wherein the first power source potential is to be supplied to the conductor pattern;
 a plurality of through-hole wirings penetrating the plurality of wiring layers in a thickness direction of the wiring substrate; and
 a plurality of signal wirings, signals that differ from the differential signals are to be transmitted to the plurality of signal wirings, respectively, wherein the plurality of through-hole wirings includes:
 a differential pair through-hole wiring electrically connected to each of the plurality of differential pair terminals;
 a plurality of first power source through-hole wirings connected to the first power source pattern, wherein the first power source potential is to be supplied to each of the plurality of first power source through-hole wirings; and
 a plurality of reference potential through-hole wirings, wherein the reference potential is to be supplied to each of the plurality of reference potential through-hole wirings, wherein the plurality of differential pair through-hole wirings includes:
 a first differential pair through-hole wiring constituted by a pair of through-hole wirings arranged along the second direction;
 a second differential pair through-hole wiring constituted by a pair of through-hole wirings arranged along the second direction; and
 a third differential pair through-hole wiring constituted by a pair of through-hole wirings arranged along the second direction, and arranged so as to be adjacent to the first differential pair through-hole wiring in the first direction, wherein the first differential pair through-hole wiring and the second differential pair through-hole wiring are arranged along the second direction, wherein a portion of the first power source pattern is arranged between the first differential pair through-hole wiring and the third differential pair through-hole wiring, wherein the first power source potential is to be supplied to each of the first semiconductor device and the second semiconductor device, wherein the first wiring layer has:
 a third region overlapping the first semiconductor device in plan view; and
 a fourth region overlapping the second semiconductor device in plan view, and wherein the first power source pattern extends so as to connect the third region and the fourth region.

2. The electronic device according to claim 1, wherein a terminal other than the plurality of differential pair terminals is arranged between two of the plurality of differential pair terminals arranged along the first side, the two being adjacent to each other in the first direction.

3. The electronic device according to claim 1, wherein some of the plurality of reference potential terminals are arranged between the first differential pair terminal and the second differential pair terminal.

4. The electronic device according to claim 1,
wherein the first power source pattern extends along the second direction.

5. The electronic device according to claim 1,
wherein some of the plurality of reference potential through-hole wirings are arranged between the first differential pair through-hole wiring and the second differential pair through-hole wiring.

6. The electronic device according to claim 1,
wherein the wiring substrate has a second wiring layer that differs from the first wiring layer,
wherein the second wiring layer has:
 a third region overlapping the first semiconductor device in plan view;
 a fourth region overlapping the second semiconductor device; and
 a differential signal wiring electrically connected to each of the plurality of differential pair terminals via the differential pair through-hole wiring, and
wherein a plurality of the differential signal wirings extends so as to connect the third region and the fourth region along the second direction.

* * * * *